(12) United States Patent
Horiuchi et al.

(10) Patent No.: US 11,594,710 B2
(45) Date of Patent: Feb. 28, 2023

(54) METHOD FOR MANUFACTURING A DISPLAY DEVICE

(71) Applicant: Lenovo (Singapore) Pte. Ltd., Singapore (SG)

(72) Inventors: Shigehiro Horiuchi, Kanagawa (JP); Tatsuya Ushioda, Kanagawa (JP); Hiroaki Kinoshita, Kanagawa (JP); Takehito Yamauchi, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 126 days.

(21) Appl. No.: 17/175,803

(22) Filed: Feb. 15, 2021

(65) Prior Publication Data
US 2022/0149337 A1 May 12, 2022

(30) Foreign Application Priority Data
Nov. 9, 2020 (JP) .............................. JP2020-186593

(51) Int. Cl.
*H01L 51/56* (2006.01)
*H01L 51/52* (2006.01)
*G02F 1/1333* (2006.01)

(52) U.S. Cl.
CPC ........ *H01L 51/56* (2013.01); *G02F 1/133314* (2021.01); *G02F 1/133325* (2021.01); *H01L 51/5237* (2013.01); *G02F 1/13338* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2021/0352814 A1* | 11/2021 | Park | G06F 1/1656 |
| 2022/0206537 A1* | 6/2022 | Park | G09F 9/30 |
| 2022/0223074 A1* | 7/2022 | Park | H01L 51/00 |

FOREIGN PATENT DOCUMENTS

JP 2018-112833 A 7/2018

\* cited by examiner

*Primary Examiner* — J. E. Schoenholtz
(74) *Attorney, Agent, or Firm* — Osha Bergman Watanabe & Burton LLP

(57) ABSTRACT

A method for manufacturing a display device that can prevent deformation of a flexible display is provided. A raw material sheet that serves as a metal sheet of the flexible display has a width that is greater than a width of the display body in Y direction and a plurality of holes are provided in a bent area of the raw material sheet over an entire width along a bent section of the display body. The method includes: mounting the display body on the raw material sheet such that the bent section and the bent area are aligned and that the display body avoids the end portions in the Y direction; applying pressure to the display body from a central part of the display body toward a periphery of the display body; and cutting the raw material sheet into a predetermined size.

8 Claims, 12 Drawing Sheets

METHOD FOR MANUFACTURING A DISPLAY DEVICE

TECHNICAL FIELD

The present invention relates to a method for manufacturing a display device including a bendable display body and a sheet member fixed to the display body.

BACKGROUND

Portable information devices such as a tablet PC and a smartphone have been rapidly spreading in recent years. Such a portable information device has a touch panel type liquid crystal display and does not have a physical keyboard. It is desirable for this kind of portable information device to have a display that is large in use but can be miniaturized to carry.

Considering this, a portable information device has been proposed in which use of a flexible display, such as an organic electro luminescence (EL) display, allows not only a chassis but also a display to be foldable (for example, see Japanese Unexamined Patent Application Publication No. 2018-112833).

As the flexible display alone lacks sufficient strength, it is desirable that a sheet member is stuck thereon. The sheet member is preferably provided with hole portions at a location corresponding to a bent section of the flexible display so that the sheet member and the flexible display can be easily bent together.

The sheet member and the flexible display can be stuck together better by further applying pressure from a central part toward a periphery of the flexible display on which the sheet member has been stuck.

The pressure application, however, causes the location of the hole portions of the sheet member to be slightly deformed to extend. When the pressure application is stopped, the location shrinks to the original shape. As the flexible display deforms in accordance with this extension and shrinkage, it is concerned that some swellings or the like may be caused thereby.

SUMMARY

One or more embodiments of the present invention provide a method for manufacturing a display device which can prevent deformation of a flexible display.

According to one or more embodiments, a method for manufacturing a display device according to a first aspect of the present invention is a method for manufacturing a display device including a bendable display body and a sheet member fixed to the display body, wherein a raw material sheet, which will serve as the sheet member, has a width that is greater than that of the display body in a direction along a bent section of the display body, and a plurality of hole portions are provided in a bent area of the raw material sheet over the entire width along the bent section of the display body, the method including: a display mounting process in which the display body is mounted on the raw material sheet in such a manner that the bent section and the bent area are aligned and that the display body avoids end portions of the raw material sheet in a direction along the bent section; a pressure application process in which pressure is applied to the display body from a central part toward a periphery thereof; and a cutting process in which the raw material sheet is cut to be the sheet member having a predetermined size.

According to the first aspect thus described, in the display mounting process, the display body is mounted on the raw material sheet in such a manner that the bent section and the bent area are aligned and that the display body avoids the end portions of the raw material sheet. This allows the display body to be barely deformed by the pressure applied from the central part toward the periphery thereof in the pressure application process while the end portions of the raw material sheet are deformed to extend. When the pressure application is stopped and the raw material sheet shrinks, the display body therefore does not shrink and the deformation such as swelling is hardly caused.

The method may further include a reinforcement process in which a reinforcing sheet having rigidity equal to or greater than that of the raw material sheet is stuck onto the raw material sheet before the pressure application process and a stripping process in which the reinforcing sheet is stripped from the raw material sheet after the pressure application process. Sticking the reinforcing sheet further prevents the raw material sheet from being deformed.

In the cutting process, a laser allows precise and easy cutting of the raw material sheet.

In addition to the bent area, an unbent hole area with hole portions is provided in the raw material sheet, and the hole portions in the bent area may be more densely provided than the hole portions in the unbent hole area.

The raw material sheet may be provided with an unbent frame area that is fixed to a periphery of the display body except in the bent area. The unbent frame area may not be provided with holes. After the cutting process, the unbent frame area remains as a frame body to support the display body more surely.

For easy bending of the display device, the hole portions in the bent area of the raw material sheet may be elongated holes extending along the bent section of the display body.

The display body may be electroluminescent, and the raw material sheet may be a stainless steel sheet or an aluminum sheet.

According to one or more embodiments, a method for manufacturing a display device according to a second aspect of the present invention is a method for manufacturing a display device including a bendable display body and a sheet member fixed to the display body, wherein a plurality of hole portions are provided in a bent area of the sheet member over an entire width thereof along a bent section of the display body, the method including: a display mounting process in which the display body is mounted on the sheet member in such a manner that the bent section and the bent area are aligned; a reinforcement process in which a reinforcing sheet having rigidity equal to or greater than that of the sheet member is stuck onto the sheet member; a pressure application process in which pressure is applied to the display body from a central part toward a periphery thereof after the reinforcement process; and a stripping process in which the reinforcing sheet is stripped from the sheet member after the pressure application process.

According to the second aspect thus described, in the reinforcement process, the reinforcing sheet having rigidity equal to or greater than that of the sheet member is stuck onto the sheet member. This allows the display body to be barely deformed by the pressure applied from the central part toward the periphery thereof in the pressure application process. When the pressure application is stopped, the display body therefore does not shrink and the deformation such as swelling is hardly caused.

The above aspects of the present invention can prevent the deformation of the flexible display.

DETAILED DESCRIPTION

The following will describe in detail an embodiment of a manufacturing method of a display device according to the present invention with reference to the drawings. Note that the present invention is not limited by the embodiment. First, a portable information apparatus 10 is described that includes a display device 16 manufactured according to the present embodiment.

Figure 1:
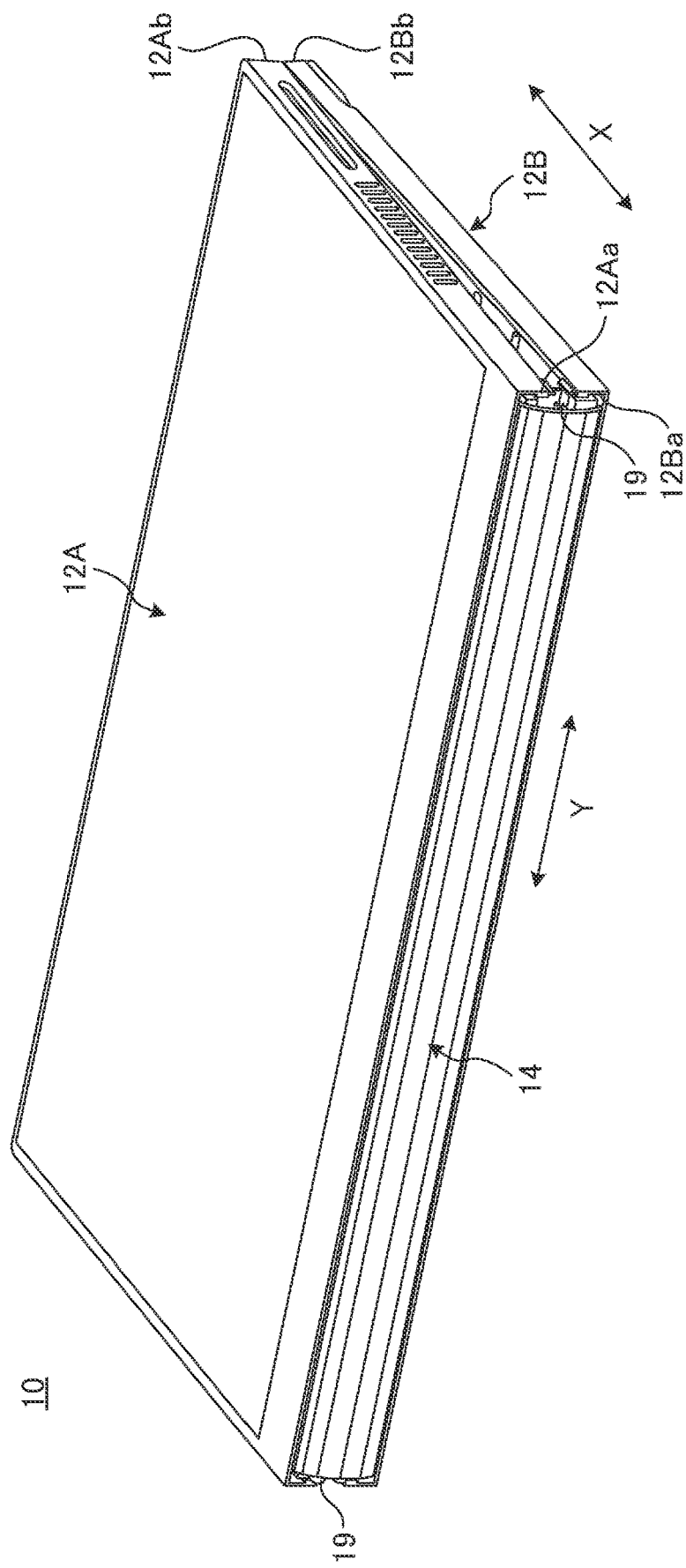
FIG. 1 is a perspective view illustrating a portable information device according to an embodiment that has been closed into a storage form.
Figure 2:
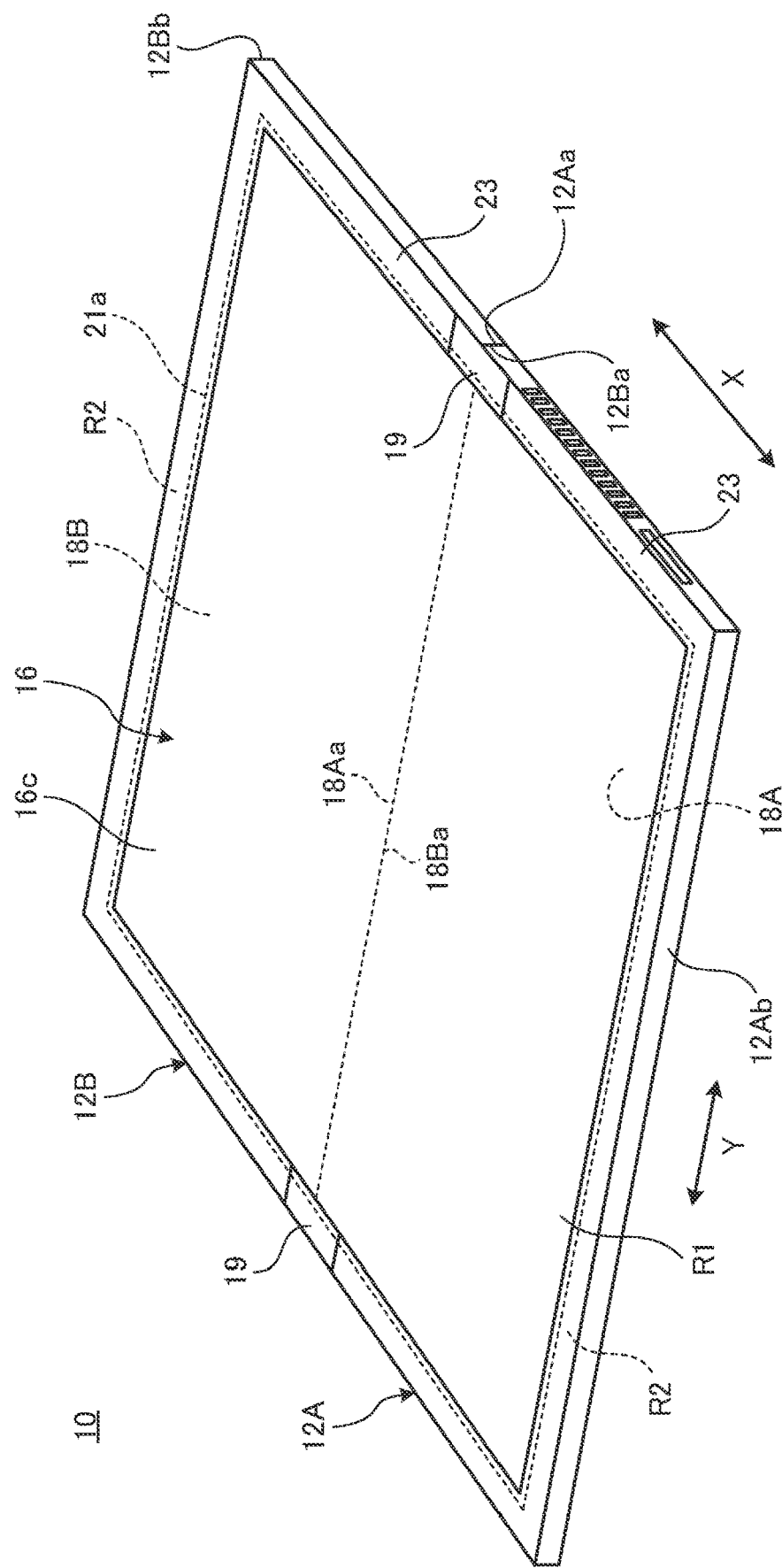
FIG. 2 is a perspective view schematically illustrating the portable information device illustrated in FIG. 1 that has been opened into a usage form.
Figure 3:
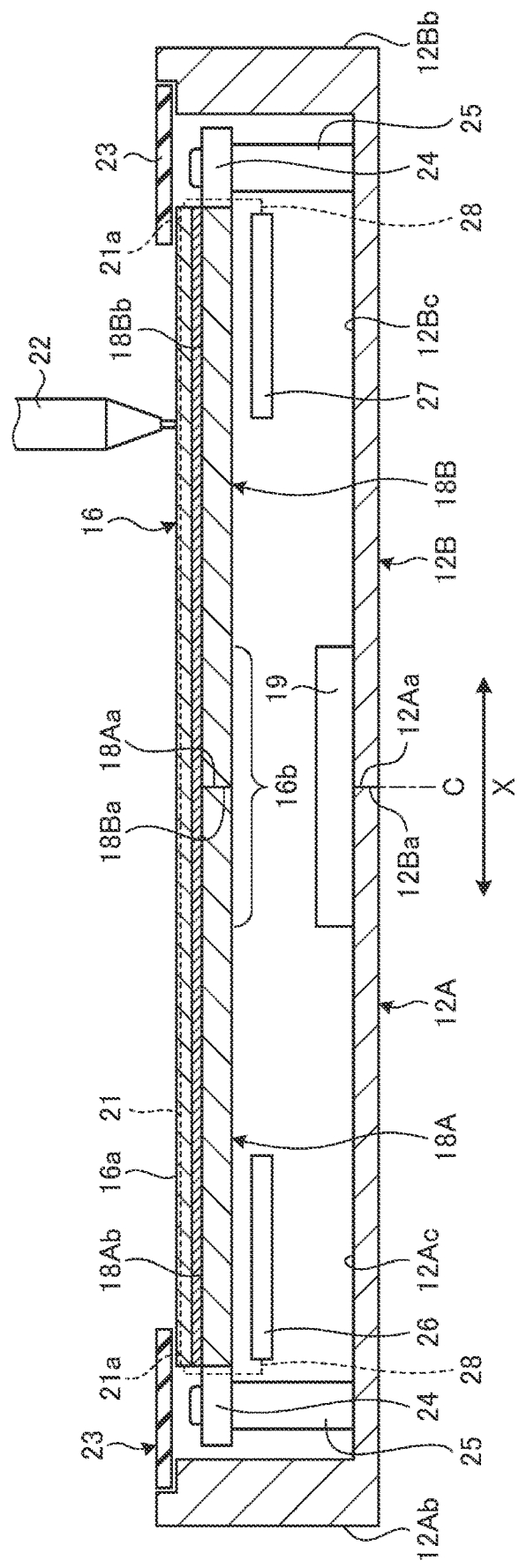
FIG. 3 is a side cross-sectional view schematically illustrating an internal structure of the portable information device illustrated in FIG. 2.

FIG. 1 is a perspective view illustrating the portable information device 10 that has been closed into a storage form. FIG. 2 is a perspective view schematically illustrating the portable information device 10 illustrated in FIG. 1 that has been opened into a usage form. FIG. 3 is a side cross-sectional view schematically illustrating an internal structure of the portable information device 10 illustrated in FIG. 2. FIG. 3 omits a foil 32, an adhesive sheet 34, and a protection sheet 38 to be described later.

As illustrated in FIGS. 1 and 2, the portable information device 10 includes a first chassis member 12A, a second chassis member 12B, a spine member 14 and a display device 16. In the present embodiment, a tablet PC that is foldable like a folio is exemplarily shown as the portable information device 10. The portable information device 10 may alternatively be a mobile phone, a smartphone, an electronic notebook, a portable game machine or the like.

Each of the chassis members 12A and 12B is a rectangular plate-like member having a side wall that is erected from three sides thereof except for a side corresponding to the spine member 14. Each of the chassis members 12A and 12B is configured by a metal plate of stainless steel, magnesium, aluminum or the like or a fiber-reinforced resin plate containing reinforced fibers such as carbon fibers, for example. The display device 16 is provided across the inner surfaces 12Ac and 12Bc of the chassis members 12A and 12B. The display device 16 is supported with respect to the inner surfaces 12Ac and 12Bc using a first support plate 18A, a second support plate 18B and a sheet member 20.

The chassis members 12A and 12B are disposed adjacently to each other. The chassis members 12A and 12B are coupled to each other by a pair of hinge mechanisms 19 and 19 that are disposed at both ends of edge portions 12Aa and 12Ba adjacent to each other. The hinge mechanisms 19 couple the chassis members 12A and 12B so that the chassis members are foldable into the storage form illustrated in FIG. 1 as well as opened to the usage form illustrated in FIG. 2. A dashed and dotted line C in FIG. 3 represents a bending center C serving as a center of a folding operation of the chassis members 12A and 12B. In the chassis members 12A and 12B, the edge portions 12Aa and 12Ba by the spine member 14 are hinge-side end portions. In the chassis members 12A and 12B, other edge portions 12Ab and 12Bb that are located opposite from the spine member 14 are open end portions.

The hinge mechanisms 19 are respectively disposed at the both ends in the longitudinal direction (Y direction) of the edge portions 12Aa and 12Ba of the chassis members 12A and 12B and are thus located outside the outer peripheral edge portion of the display device 16. In the portable information device 10 of the present embodiment, a rotation center of the chassis members 12A and 12B defined by the hinge mechanism 19 coincides with a front side 16a of the display device 16.

In the following description of the portable information device 10, directions from the central spine member 14 to the other edge portions 12Ab and 12Bb are referred to as X direction and directions along the longitudinal direction of the spine member 14 are referred to as Y direction as illustrated in FIGS. 1 and 2.

The display device 16 is a touch panel type liquid crystal display, for example. As illustrated in FIG. 3, the touch panel 21 is of electrostatic capacitance type and receives a touch operation by a pen input device 22 such as a digitizer pen and a touch operation by a person's fingertip. The display device 16 is a flexible display. This allows the display device 16 to be opened/closed along with an opening/closing operation of the chassis members 12A and 12B. A bezel member 23 is disposed on an outer peripheral edge portion of the front side 16a of the display device 16. The bezel member 23 covers a non-display region (inactive region) R2 which is a region excluding a display region (active region) R1 and arranged in the outer peripheral edge portion of the front side of the display device 16. A touch operation valid region of the touch panel 21 is arranged in the same area as the display region R1 of the display device 16. The touch panel 21 has a wiring region 21a that is about 5 mm in width and is provided at a location overlapping the non-display region R2 surrounding the display region R1 (see FIGS. 2 and 3).

As illustrated in FIG. 3, for example, the display device 16 is positioned to be fixed to the chassis members 12A and 12B via attachment pieces 24 protruding from outer peripheral end faces of the support plates 18A and 18B. There are provided a plurality of attachment pieces 24 at appropriate locations in the outer peripheral edge portions of the support plates 18A and 18B except for the adjacent edge portions 18Aa and 18Ba. The attachment pieces 24 are screwed to boss portions 25 provided on the inner surfaces 12Ac and 12Bc, for example. The support plates 18A and 18B are thus attached to the inner surfaces 12Ac and 12Bc of the chassis members 12A and 12B respectively.

In a chassis internal space surrounded by the chassis members 12A and 12B and the support plates 18A and 18B, various components including a substrate, various semiconductor chips such as CPU, etc., a communication module, a battery unit, and a cooling unit are mounted to be fixed. A reference sign 26 in FIG. 3 refers to a control substrate (control board) for the display device 16. A reference sign 27 in FIG. 3 refers to a control substrate (touch IC) for the touch panel of the display device 16. These control substrates 26 and 27 are connected to the display device 16 via a flexible substrate 28 shown by a broken line in FIG. 3.

The spine member 14 is formed of a thin, flexible plate-like member and becomes a spine when the portable information device 10 is folded. The spine member 14 is provided across the chassis members 12A and 12B to cover the edge portions 12Aa and 12Ba from an inside thereof. As illustrated in FIG. 1, when the portable information device 10 is in the storage form, the edge portions 12Aa and 12Ba of the chassis members 12A and 12B are largely separated to generate a gap therebetween. The spine member 14 covers this gap between the edge portions 12Aa and 12Ba so that the display device 16 and various components located inside are not exposed.

An exemplary structure of the support plates 18A and 18B is now described. As illustrated in FIG. 3, each of the support plates 18A and 18B is a thin, plate member. The support plates 18A and 18B support the display device 16 on top surfaces 18Ab and 18Bb thereof. The support plates 18A and 18B are supported by the chassis members 12A and 12B respectively and are opened and closed around the bending center C like a folio.

Each of the support plates 18A and 18B is formed of a metal plate of stainless steel, magnesium, aluminum or the like or a fiber-reinforced resin plate produced by impregnating reinforced fibers such as carbon fibers in a matrix resin containing a thermosetting resin and a thermoplastic resin, for example. In the usage form, the adjacent edge portions 18Aa and 18Ba of the support plates 18A and 18B abut on each other (see FIG. 6(a)). In the storage form, the edge portions 18Aa and 18Ba of the support plates 18A and 18B are separated from each other (see FIG. 6(b)).

Figure 6A:
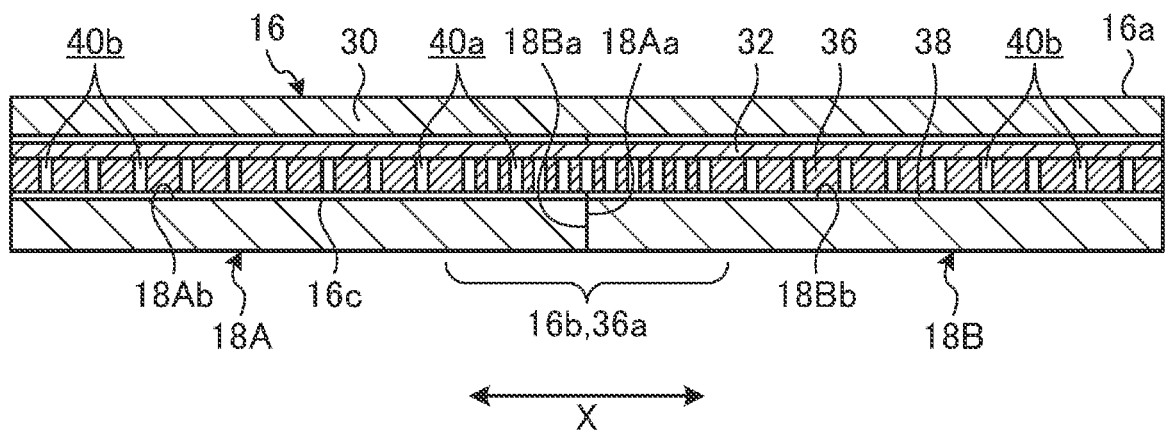
FIG. 6(a) is a side cross-sectional view schematically illustrating a structure of the sheet member and its peripheral part in the usage form.
Figure 6B:
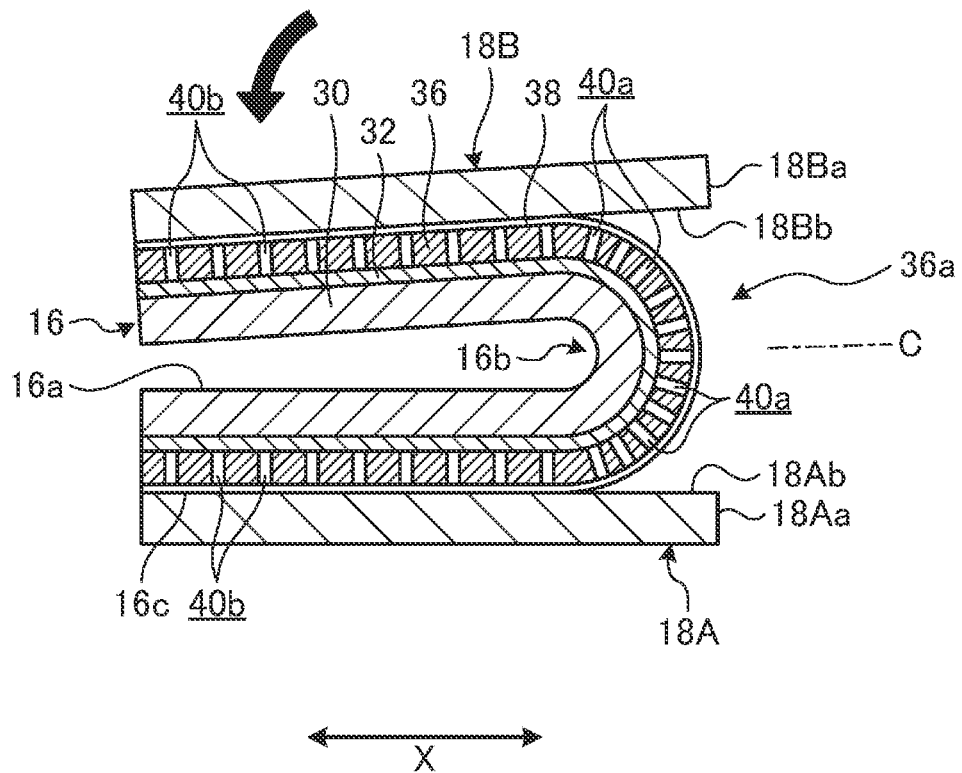
FIG. 6(b) is a side cross-sectional view schematically illustrating the structure of the sheet member and its peripheral part in the storage form.

On the back side 16c of the display device 16, only a strip area corresponding to the bent section 16b (the bent section of the display body, see FIG. 3) of the display device 16 is not fastened with the top surfaces 18Ab and 18Bb so as to be free to move (see FIG. 6(b)).

Figure 4:
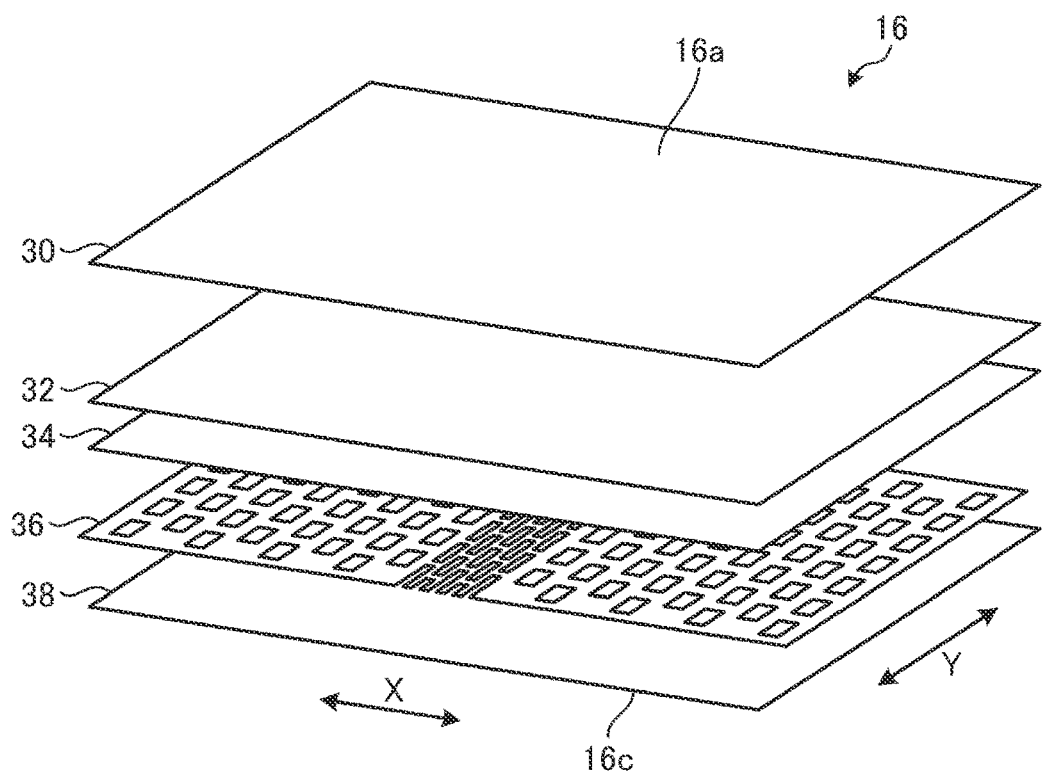
FIG. 4 is an exploded perspective view schematically illustrating a structure of a sheet member.
Figure 5:
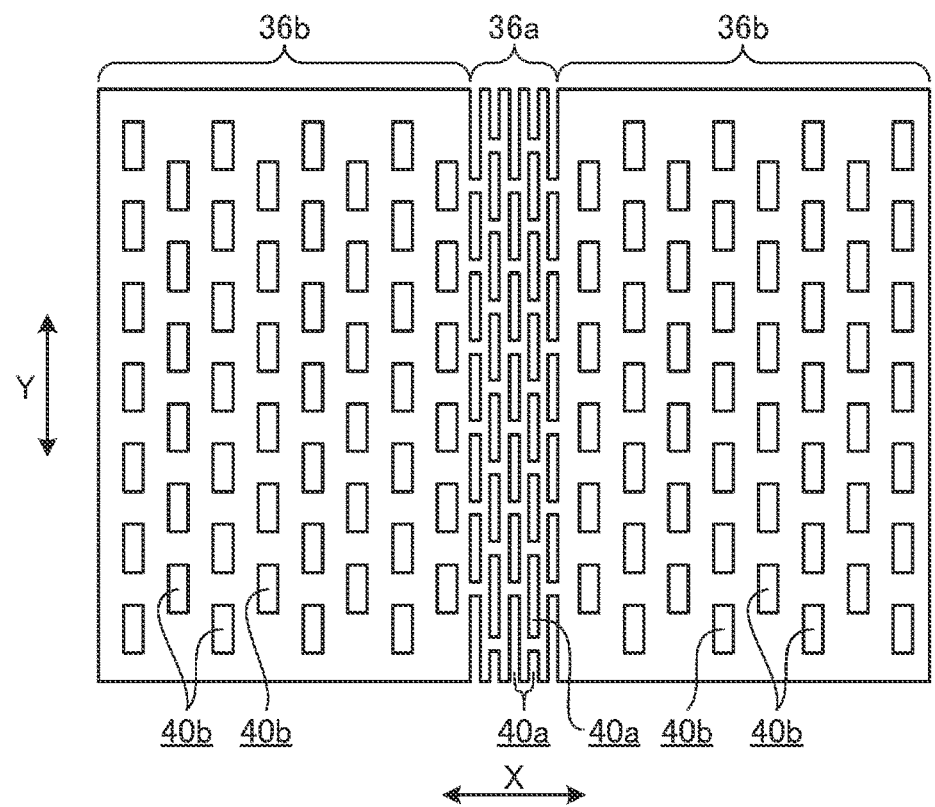
FIG. 5 is a plan view of a metal sheet.

FIG. 4 is an exploded perspective view schematically illustrating a structure of the display device 16. FIG. 5 is a plan view of a metal sheet (sheet member) 36. FIG. 6(a) is a side cross-sectional view schematically illustrating a structure of the display device 16 and its peripheral part in the usage form. FIG. 6(b) is a side cross-sectional view schematically illustrating the structure of the display device 16 and its peripheral part in the storage form.

As illustrated in FIG. 4, the display device 16 includes a display body 30, a foil 32, an adhesive sheet 34, a metal sheet 36, and a protection sheet 38. The display body 30 is a flexible display such as an organic EL display having a paper structure with high flexibility, for example. The foil 32 is a sheet body and is provided on a back surface of the display body 30. The foil 32 may be included in the display body 30. The adhesive sheet 34 adheres to the foil 32 and the metal sheet 36 to fix them. The protection sheet 38 is a resin sheet, for example, and is provided on a back side of the metal sheet 36. The protection sheet 38 protects the metal sheet 36 and prevents foreign matter from entering the hole portions 40a and 40b described later.

Each of the metal sheet 36 and raw material sheets 42, 42A and 52 described later is a metal sheet such as a stainless steel sheet, an aluminum sheet or the like and has appropriate strength to support the display body 30. The metal sheet 36 of the present embodiment is formed of SUS 301 or SUS 304 austenitic stainless steel, for example. A plate thickness of the metal sheet 36 is about 150 μm, for example. The metal sheet 36 serves to complement the strength of the thin display body 30 and thus preferably has appropriate rigidity. Use may be made not only of metal but also of a carbon sheet, for example. The carbon sheet is a carbon-fiber-reinforced resin sheet produced by impregnating carbon fibers in a matrix resin containing a thermosetting resin and a thermoplastic resin, for example. The metal sheet 36 is cut out from the raw material sheet 42 described later.

As illustrated in FIG. 5, a plurality of hole portions 40a are provided over an entire width in the Y direction of a bent area 36a in a central part of the metal sheet 36. In addition to the bent area 36a, the metal sheet 36 includes two unbent hole areas 36b respectively provided with a plurality of hole portions 40b. The two unbent hole areas 36b are arranged symmetrically about the bent area 36a.

Although the plurality of hole portions 40b are provided over the entire width in the Y direction in the unbent hole area 36b, they may not necessarily be provided over the entire width in the Y direction and may even be omitted depending on a design condition. Providing the hole portions 40b, however, reduces a weight of the metal sheet 36.

The hole portions 40a and 40b are elongated holes extending in the Y direction. The elongated hole portions 40a are arranged in the Y direction and form a plurality of columns in the X direction. The hole portions 40a in neighboring columns are alternately located in the Y direction. The elongated hole portions 40b are arranged in the Y direction and form a plurality of columns in the X direction. The hole portions 40b in neighboring columns are alternately located in the Y direction. Opening areas of the hole portions 40a are smaller than those of the hole portions 40b.

The hole portions 40a in the bent area 36a are more densely provided than the hole portions 40b in the unbent hole areas 36b. The high density of the hole portions 40a, shapes of the hole portions 40a elongated in the Y direction along the bent section 16b, and the arrangement of the hole portions 40a in the Y direction allow the bent area 36a to be easily bent along the Y direction.

The opening areas of the hole portions 40a and 40b are preferably smaller than at least an area of a nib (equivalent to a diameter of 1 mm) of a pen input device 22 used with the portable information device 10. In the present embodiment, a long diameter of each of the hole portions 40a and 40b is thus set to 0.5 mm or smaller, preferably 0.2 mm or 0.3 mm, for example. The metal sheet 36 of the present embodiment is a punched metal sheet or the like provided with the hole portions 40a and 40b penetrating the sheet. The shapes of the hole portions 40a and 40b may not only be elongated but also be circular or rectangular.

Owing to the metal sheet 36 having a certain thickness, the bent section 16b of the display device 16 in the portable information device 10 may be bent at a desired radius of curvature upon design. The plurality of hole portions 40a in the bent area 36a of the metal sheet 36 serve to prevent external force required for the bending operation from being excessively great and to suppress increase in weight.

As illustrated in FIGS. 6A and 6B, a bottom surface of the protection sheet 38 of the display device 16 is fixed to the top surfaces 18Ab and 18Bb of the support plates 18A and 18B. The adhesion and fixation of the protection sheet 38 and the support plates 18A and 18B are achieved by using an adhesive, a double-sided tape or the like, for example. As described above, the part of the bottom surface of the protection sheet 38 that corresponds to the bent section 16b is not fixed to the support plates 18A and 18B so as to be able to contact therewith and separate therefrom (see FIG. 6(b)).

(First Manufacturing Method)

Figure 7A:
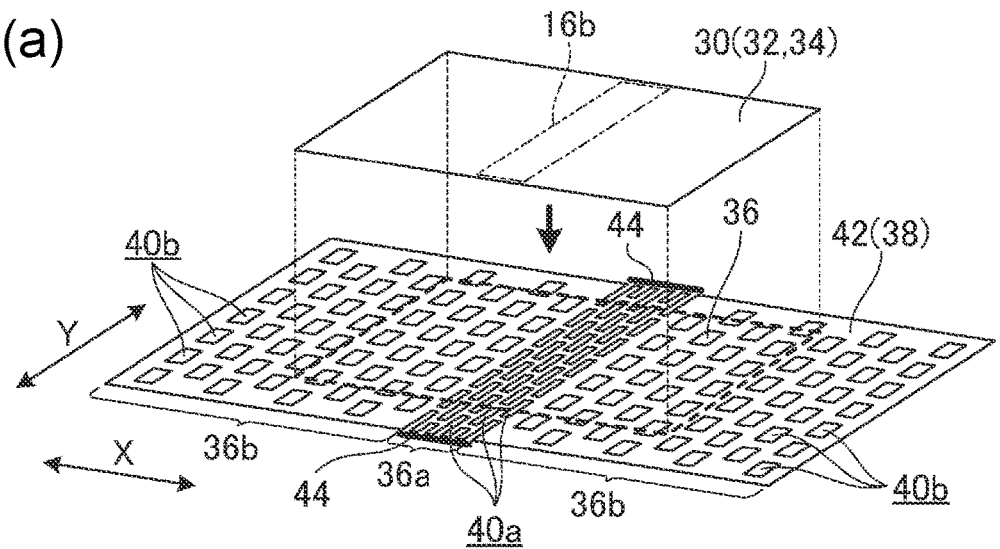
FIGS. 7(a)-7(c) illustrate a first manufacturing method of the display device according to an embodiment, wherein 7(a) illustrates a first step thereof, 7(b) a second step, and 7(c) a third step.
Figure 7B:
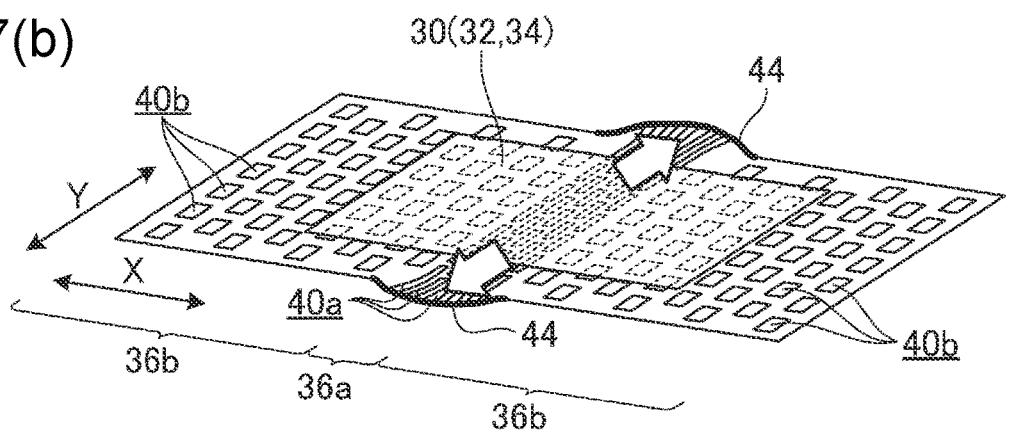
Figure 7C:
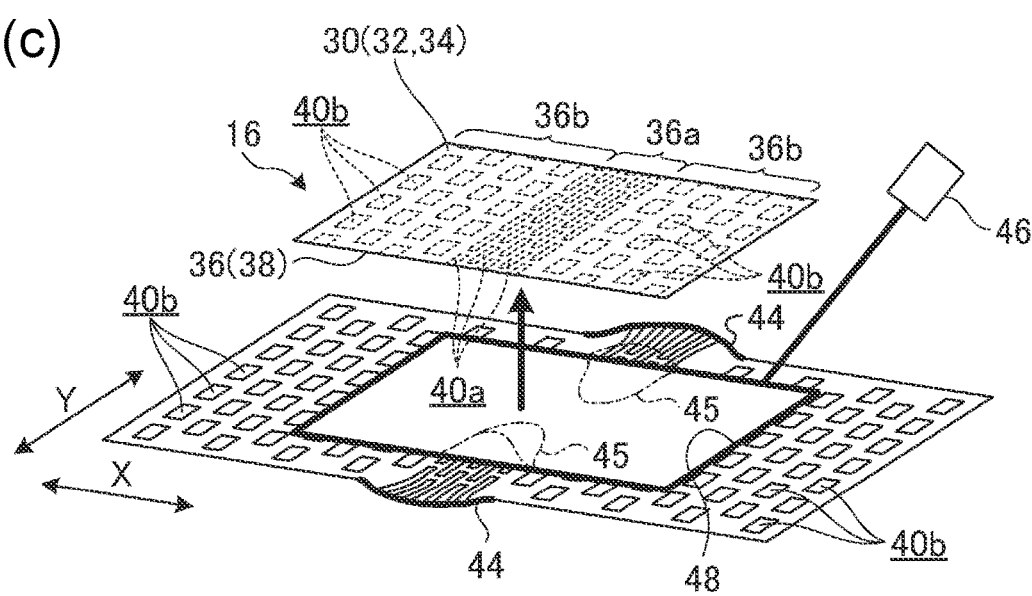
Figure 8:
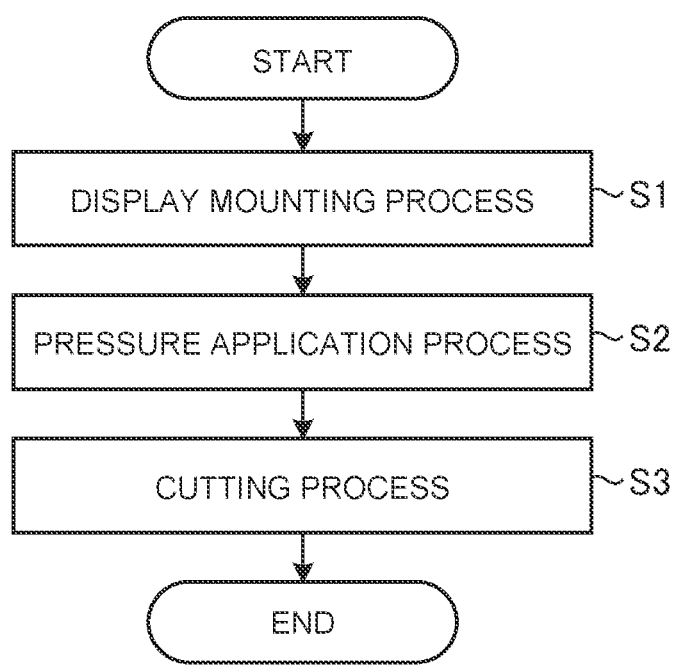
FIG. 8 is a flow chart of the first manufacturing method of the display device according to an embodiment.

A first manufacturing method of the display device 16 is now described. FIGS. 7(a)-(c) illustrate the first manufacturing method of the display device 16, wherein 7(a) illustrates a first step thereof, 7(b) a second step, and 7(c) a third step. FIG. 8 is a flow chart of the first manufacturing method of the display device 16. A raw material sheet 42 is used in the first manufacturing method of the display device 16. The raw material sheet 42 is a material which will serve as the metal sheet 36.

As illustrated in FIGS. 7(a)-7(c), a central part of the raw material sheet 42 indicated by a broken line will serve as the metal sheet 36. The raw material sheet 42 is sized to be moderately larger than the display body 30 both in the Y direction (i.e., the direction along the bent section 16b) and the X direction. Depending on a design condition, the raw material sheet 42 and the display body 30 may be sized to be equal in the X direction.

As described with respect to the metal sheet 36, in the raw material sheet 42, the plurality of hole portions 40a are provided over the entire width in the Y direction of the bent area 36a. Also as described with respect to the metal sheet 36, in the raw material sheet 42, the plurality of hole portions 40b are provided over the entire width in the Y direction of the unbent hole areas 36b. That is, in the raw material sheet 42, the hole portions 40a and 40b are arranged in the Y direction and form a plurality of columns in the X direction, and the hole portions 40a and 40b in the neighboring columns are alternately located in the Y direction. The two unbent hole areas 36b extend in the X direction to ends of the raw material sheet 42.

In the first manufacturing method of the display device 16, first, a display mounting process is performed in step S1 of FIG. 8 in which the display body 30 is mounted on the raw material sheet 42. Specifically, the display body 30 is mounted on the central part of the raw material sheet 42 as illustrated in FIG. 7(a). The display body 30 is placed in such a manner that a part thereof corresponding to the bent section 16b is aligned with the bent area 36a of the raw material sheet. Mounting the display body 30 thus on the central part of the raw material sheet 42 allows end portions in the Y direction of the raw material sheet 42 to be avoided. The display body 30 may not necessarily be mounted on the central part of the raw material sheet 42. Avoiding the end portions 44 is sufficient to obtain an appropriate effect of preventing deformation described later.

Figure 12A:
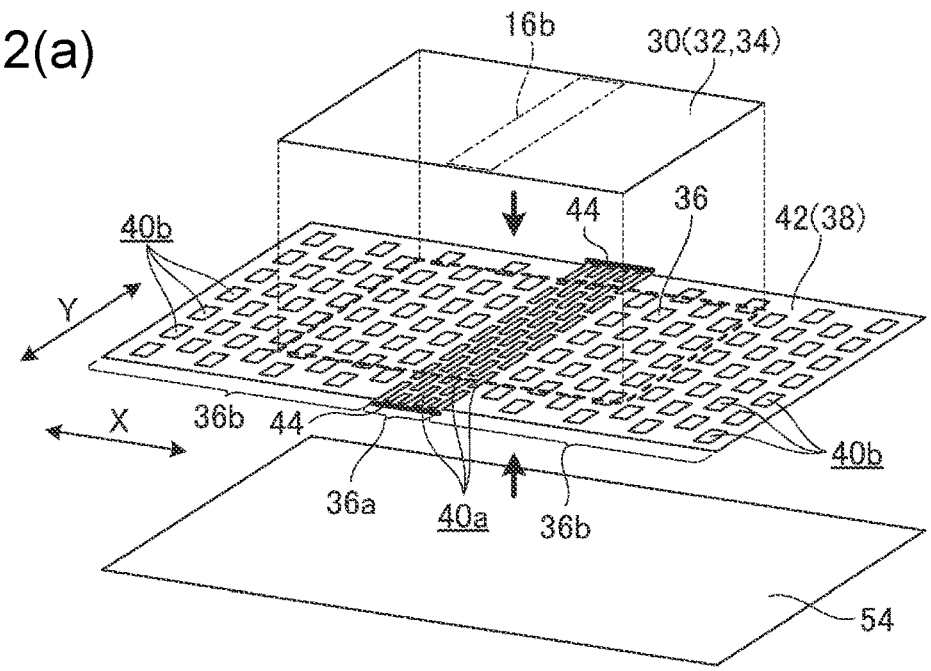
FIGS. 12(a)-(c) illustrate a third manufacturing method of the display device according to an embodiment, wherein 12(a) illustrates a first step thereof, 12(b) a second step, and 12(c) a third step.
Figure 12B:
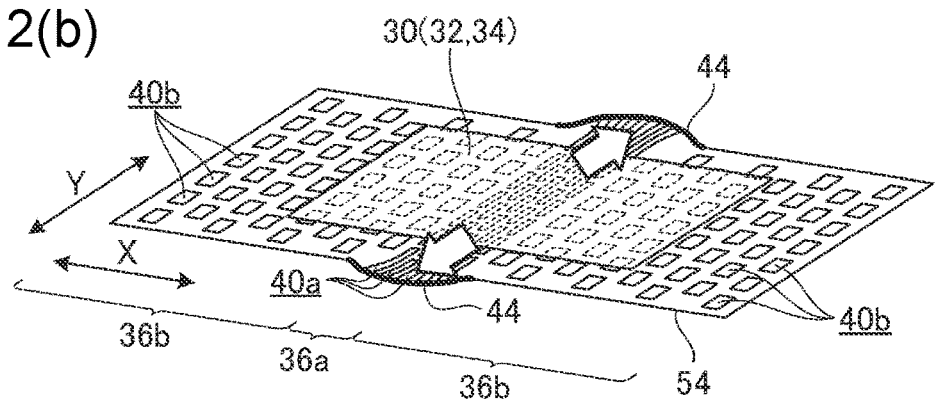
Figure 12C:
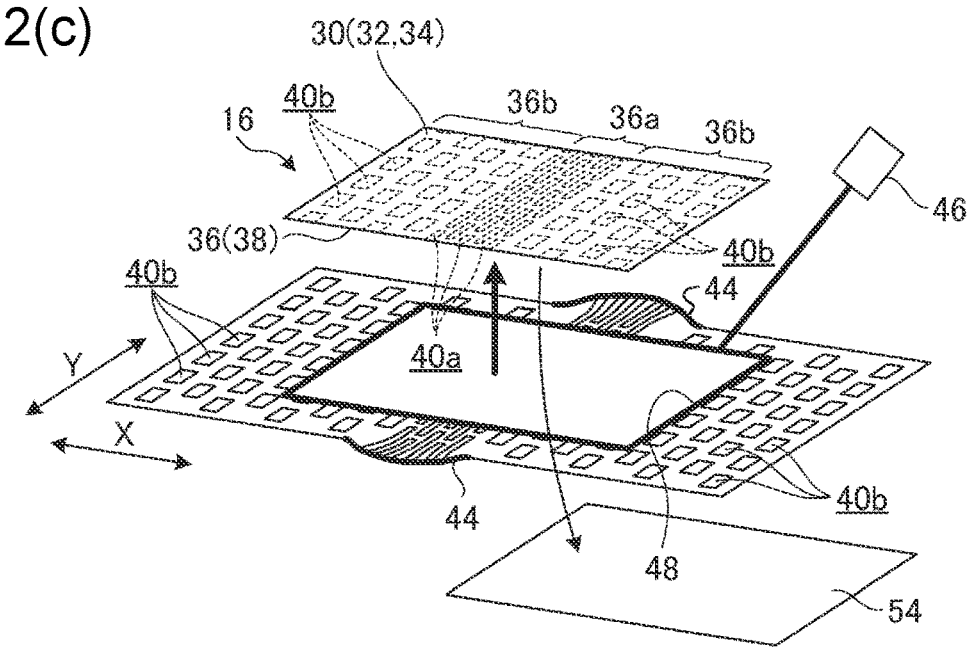

Note that the end portions 44 are clearly represented by thick lines in FIGS. 7 and 12. The display body 30 includes the foil 32 and the adhesive sheet 34. The protection sheet 38 is provided on an entire back surface of the raw material sheet 42. The display body 30 is fixed by the adhesive sheet 34. The adhesive sheet 34, however, does not provide excessively firm fixation to the raw material sheet 42 but allows the display body 30 to be free to move appropriately.

In step S2, a pressure application process is performed in which pressure is applied to the display body 30 from a central part toward a periphery thereof as indicated by outlined arrows in FIG. 7(b). The pressure application process is performed to stick the raw material sheet 42 and the display body 30 together well. A mechanism for applying pressure is not particularly limited. A roller may be rolled on the display body from the central part toward the periphery thereof or an elastic body may be pressed on the display body, for example.

The pressure applied to the display body 30 in the pressure application process is also applied to the raw material sheet 42 thereunder. As the bent area 36a of the raw material sheet 42 is densely provided with hole portions 40a for easy bending, it has low rigidity. Specifically, in terms of the X direction, deformation of the bent area 36a is suppressed, because it has a short length, is provided with alternately located hole portions 40a, and is sandwiched between the unbent hole areas 36b that are relatively rigid. In terms of the Y direction, on the other hand, the bent area 36a is easily deformed to extend because the hole portions 40a are densely provided over the entire width in the Y direction. The deformation tends to be exhibited particularly at the end portions 44 that are open in the Y direction (in FIG. 7(b), the extension of the end portions 44 toward the open sides in the Y direction is schematically exaggerated).

Note that, however, the raw material sheet 42 is sized to be larger than the display body 30 at least in the Y direction, and that the display body 30 is positioned to avoid the end portions 44 in the Y direction. That is, the display body 30 is not mounted on the end portions 44 and its vicinity that are subjected to the great deformation and thus is prevented from being deformed along with the raw material sheet 42.

When the pressure application is stopped, the slightly extended raw material sheet 42 shrinks to its original shape. However, as the display body 30 is not stuck to the raw material sheet 42 in the deformed part, the display body 30 does not shrink and thus no deformation such as a swelling arises. In FIG. 7(c), virtual lines schematically illustrate a pair of swellings 45 that may arise if no countermeasure as in the present embodiment is taken. The present embodiment prevents the swellings 45 from arising that damage appearance quality and visibility of the display body 30.

In step S3, a cutting process is performed in which the raw material sheet 42 is cut into the metal sheet 36 with a predetermined size as illustrated in FIG. 7(c). The predetermined cutting size is basically equal to the size of the display body 30 both in the X and Y directions. Specifically, the cutting is performed along a periphery of the display body 30 mounted and fixed on the raw material sheet 42. Depending on a design condition, the predetermined size may be somewhat larger than the display body 30 and the raw material sheet may be cut accordingly. A laser 46, for example, allows precise and easy cutting of the raw material sheet 42.

A unit thus cut and taken out from a cut hole 48 serves as the display device 16. The metal sheet 36 in the display device 16, which has been cut out from that part of the raw material sheet 42 which avoids the end portions 44 subjected to the deformation due to the pressure application process, barely experience the deformation in the Y direction in the bent area 36a. As a result, the deformation such as swelling is hardly caused to the display body 30 stuck onto the metal sheet 36.

As described above, in the first manufacturing method, the display body 30 is mounted on the raw material sheet 42 in step S1 (display mounting process) in such a manner that the bent section 16b and the bent area 36a are aligned and that the display body 30 avoids the end portions 44 in the Y direction. This allows the display body 30 to be barely deformed while the pressure application to the display body 30 from the central part toward the periphery thereof in step S2 (pressure application process) deforms the end portions 44 of the raw material sheet 42 to extend. When the pressure application is stopped and the raw material sheet 42 shrinks. The display body 30, however, does not shrink and the deformation such as swelling is hardly caused.

Figure 9:
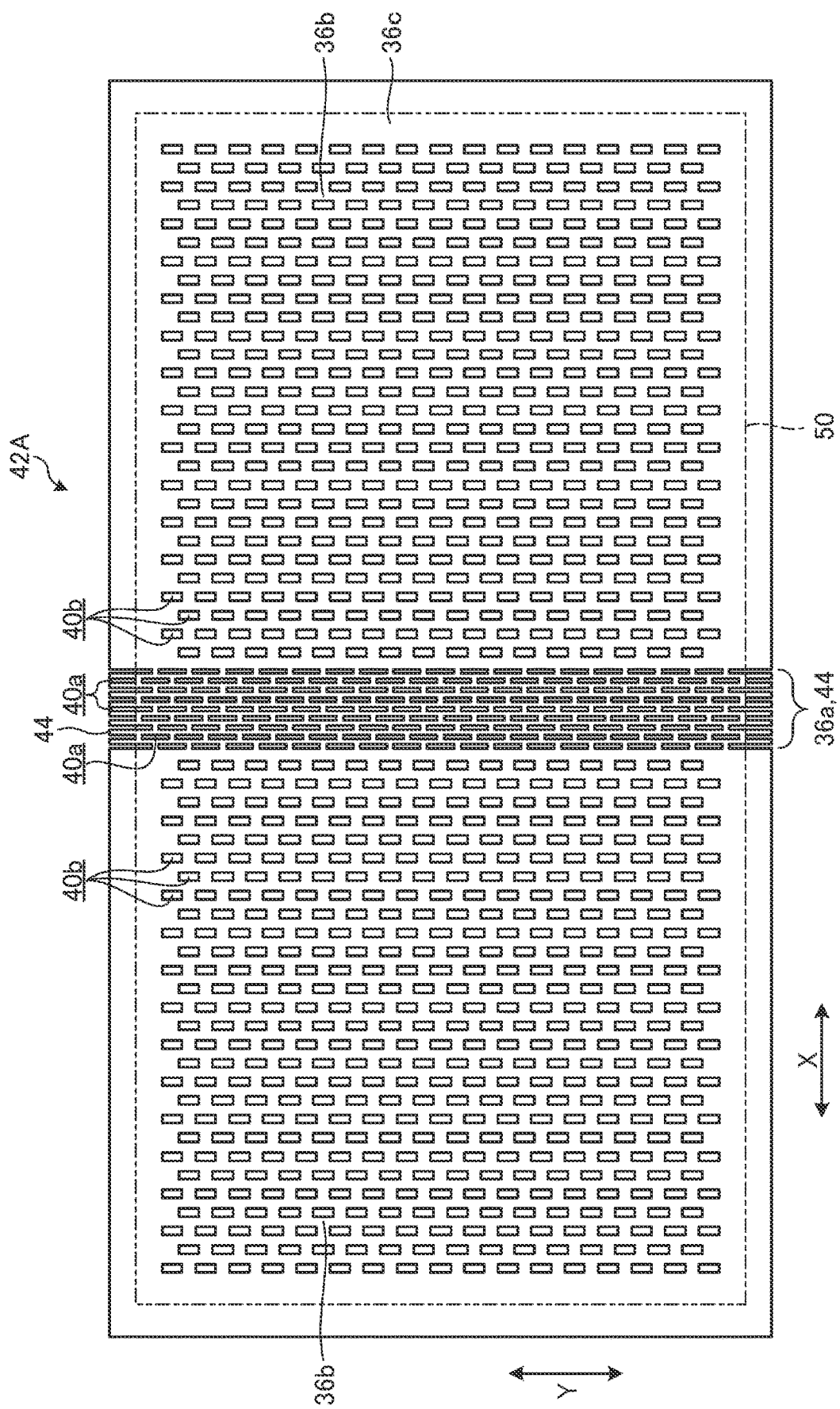
FIG. 9 is a plan view of a raw material sheet according to a modified example.

FIG. 9 is a plan view of a raw material sheet 42A according to a modified example. The above raw material sheet 42 may be replaced by the raw material sheet 42A according to the modified example. A bent area 36a of the raw material sheet 42A is the same as that of the raw material sheet 42. The raw material sheet 42A is provided with an unbent frame area 36c in an entire periphery thereof except the end portions 44 and their vicinity in the Y direction of the bent area 36a. The bent area 36a and the unbent frame area 36c surrounds the two unbent hole areas 36b on left and right sides of the raw material sheet 42A that are same as the above-described unbent hole areas.

In the same manner as on the raw material sheet 42 described above, the display body 30 is mounted on the raw material sheet 42A in the central part thereof as indicated by a virtual line to avoid the end portions 44 in the Y direction. An inner periphery of the unbent frame area 36c is positioned inside of the display body 30 and an outer periphery of the unbent frame area 36c is positioned outside of the display body 30. Thus, when the display body 30 is mounted on the raw material sheet 42A, the pressure is applied, and then cutting is performed along the virtual line, a part along an outside of the unbent hole areas 36b remains as a frame body to support the display body 30 more surely.

(Second Manufacturing Method)

Figure 10A:
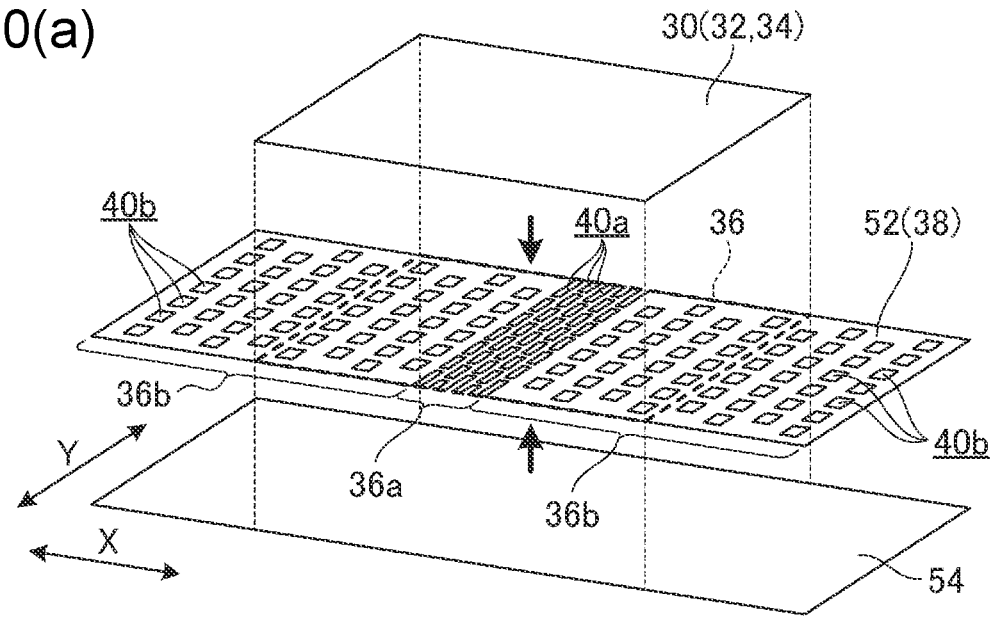
FIGS. 10(a)-(c) illustrates a second manufacturing method of the display device according to an embodiment, wherein 10(a) illustrates a first step thereof, 10(b) a second step, and 10(c) a third step.
Figure 10B:
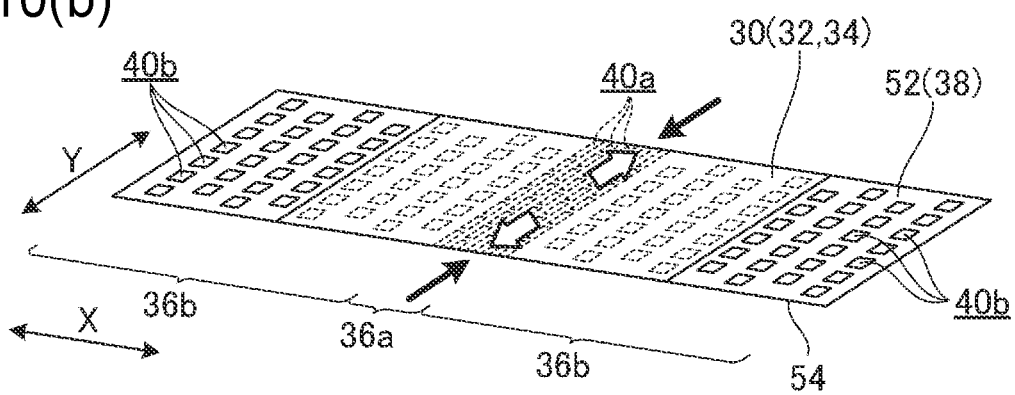
Figure 10C:
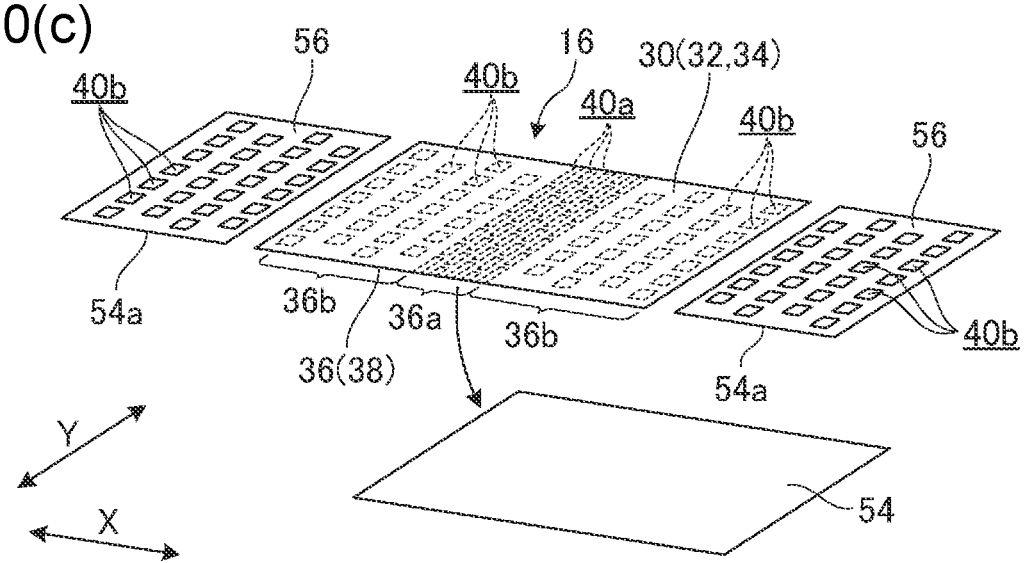
Figure 11:
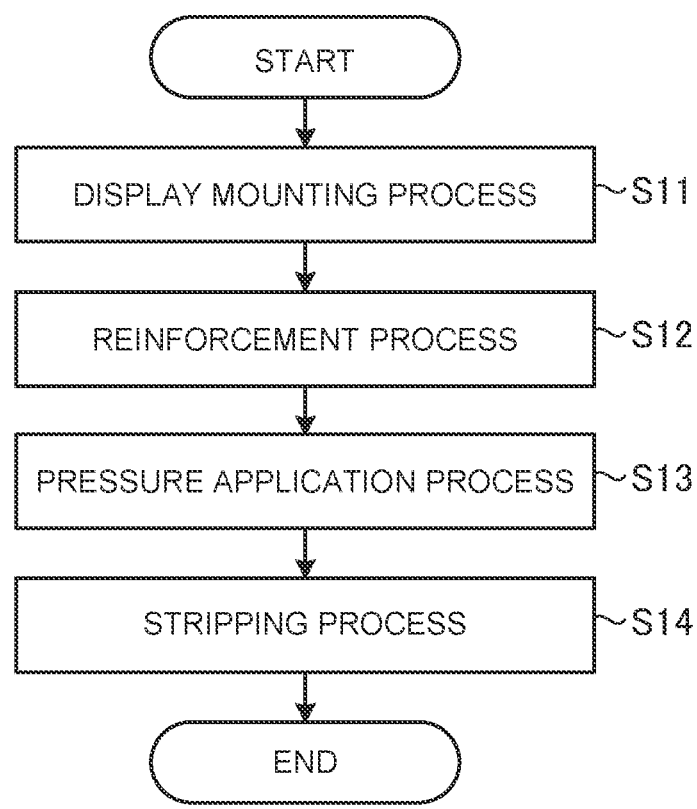
FIG. 11 is a flow chart of the second manufacturing method of the display device according to an embodiment.

A second manufacturing method of the display device 16 is now described. FIGS. 10(a)-(c) illustrate the second manufacturing method of the display device 16, wherein 10(a) illustrates a first step thereof, 10(b) a second step, and 10(c) a third step. FIG. 11 is a flow chart of the second manufacturing method of the display device 16. A raw material sheet 52 and a reinforcing sheet 54 are used in the second manufacturing method of the display device 16. The raw material sheet 52 is a material which will serve as the metal sheet 36.

As illustrated in FIGS. 10(a)-10(c), a central part of the raw material sheet 52 will serve as the metal sheet 36. The raw material sheet 52 is sized to be equal to the display body 30 in the Y direction and larger than the display body 30 in the X direction. The two unbent hole areas 36b extend in the X direction to ends of the raw material sheet 52. Depending on a design condition, the raw material sheet 52 and the display body 30 may be sized to be equal in the X direction. That is, the raw material sheet 52 may be the metal sheet 36 itself.

The reinforcing sheet 54 is a sheet having rigidity equal to or greater than that of the metal sheet 36 and the raw material sheet 52 and is made of metal, resin or others having an appropriate thickness, for example. The reinforcing sheet 54 has, at least in plan view, the same area and shape as the metal sheet 36 and preferably as the raw material sheet 52.

In the second manufacturing method of the display device 16, first, a display mounting process is performed in step S11 of FIG. 11 in which the display body 30 is mounted on the raw material sheet 52 (see FIG. 10(a)). The display mounting process is basically the same as step S1 described above except that the display body 30 is aligned with the raw material sheet 52 in the Y direction.

In step S12, a reinforcement process is performed in which the reinforcing sheet 54 is stuck onto a back side of the raw material sheet 52. Detachable means such as adhesive means is used to stick the reinforcing sheet 54 to the raw material sheet 52. The steps S11 and S12 may be performed in inverse order.

In step S13, a pressure application process is performed in which pressure is applied to the display body 30 from a central part toward a periphery thereof as indicated by outlined arrows in FIG. 10(b). The pressure application process is performed in the same way as step 2 described above to stick the raw material sheet 52 and the display body 30 together.

Note that the pressure applied to the display body 30 in the pressure application process is also applied to the raw material sheet 52 thereunder. As described above, the bent area 36a has low rigidity. The reinforcing sheet 54 stuck onto the back side of the raw material sheet 52, however, has appropriate strength and barely deforms in the X and Y directions. This prevents the end portions of the bent area 36a of the raw material sheet 52 stuck onto the reinforcing sheet 54 from being deformed in the Y direction. It is needless to say that the bent area 36a is not deformed in the X direction.

In step S14, a cutting process is performed in which the raw material sheet 52 is cut into a predetermined size. As the raw material sheet 52 has been sized to be equal to the display body 30 in the Y direction, the cutting is performed along the ends of the display body 30 in the X direction. With this cutting process, pieces 56 are cut off from the ends in the X direction of the raw material sheet 52 as illustrated in FIG. 10(c). In the cutting process, the reinforcing sheet 54 is cut along with the raw material sheet 52. Cut pieces 54a of the reinforcing sheet 54 are stuck on back sides of the pieces 56. The reinforcing sheet 54 may not be completely cut depending on a thickness thereof. As in step S3 described above, the laser 46 is used to perform the cutting process.

In step S15, a stripping process is performed in which the reinforcing sheet 54 is removed from the back side of the metal sheet 36 as illustrated in FIG. 10(c). Removing the reinforcing sheet 54 yields the display device 16 including the display body 30 and the metal sheet 36. As the pressure application process in step S13 described above has not resulted in any swelling or the like in the display body 30, the display body 30 of the display device 16 after the removal of the reinforcing sheet 54 naturally has no deformation such as swelling.

The predetermined cutting size is basically equal to the size of the display body 30 both in the X and Y directions. Specifically, the cutting is performed along a periphery of the display body 30 mounted and fixed on the raw material sheet 52. Depending on a design condition, the cutting may be performed to a size that is somewhat larger than the display body 30.

As described above, in the second manufacturing method, the reinforcing sheet 54 having rigidity equal to or greater than that of the raw material sheet 52 is stuck onto the raw material sheet 52 in step S12 (reinforcement process). This allows the display body 30 to be barely deformed upon the pressure application to the display body 30 from the central part toward the periphery thereof in step S13 (pressure application process). It is needless to say that stopping the pressure application does not cause the display body 30 to shrink, and the deformation such as swelling is hardly caused.

(Third Manufacturing Method)

Figure 13:
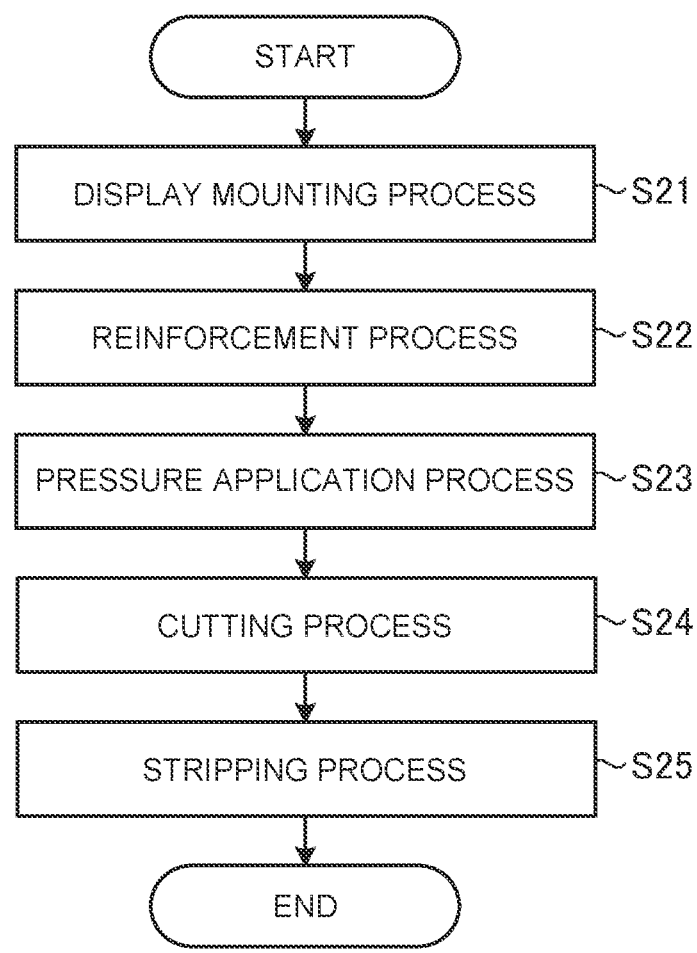
FIG. 13 is a flow chart of the third manufacturing method of the display device according to an embodiment.

A third manufacturing method of the display device 16 is now described. FIGS. 12(*a*)-(*c*) illustrate the third manufacturing method of the display device 16, wherein 12(a) illustrates a first step thereof, 12(*b*) a second step, and 12(*c*) a third step. FIG. 13 is a flow chart of the third manufacturing method of the display device 16. The raw material sheet 42 used in the first manufacturing method and the reinforcing sheet 54 used in the second manufacturing method are used in the third manufacturing method of the display device 16. The reinforcing sheet 54 used in the third manufacturing method is sized to be equal to the raw material sheet 42.

In the third manufacturing method of the display device 16, first, a display mounting process is performed in step S21 of FIG. 13 in which the display body 30 is mounted on the raw material sheet 42 (see FIG. 12(*a*)). The display mounting process is basically the same as step S1 described above.

In step S22, a reinforcement process such as the one in step S12 described above is performed in which the reinforcing sheet 54 is stuck onto the back side of the raw material sheet 42.

In step S23, a pressure application process such as the ones in steps S2 and S13 described above is performed. As in step S2, the raw material sheet 42 is sized to be larger than the display body 30 at least in the Y direction and the display body 30 is positioned to avoid the end portions 44 in the Y direction. This prevents the display body 30 from being deformed along with the raw material sheet 42. Furthermore, as in step S13, the reinforcing sheet 54 is stuck onto the back side of the raw material sheet 42, which prevents the display body 30 from being deformed in the end portions 44 of the bent area 36*a* in the Y direction.

In step S24, a cutting process such as the one in step S3 is performed in which a predetermined region of the raw material sheet 42 is cut out. Then in step S25, a stripping process such as the one in step S14 is performed in which the reinforcing sheet 54 is stripped from the back side of the metal sheet 36, which yields the display device 16.

As described above, in the third manufacturing method, double countermeasures are taken that the display body 30 is mounted on the raw material sheet 42 to avoid the end portions 44 and that the reinforcing sheet 54 is stuck. This allows further prevention of the deformation of the bent area 36*a*. The above-described manufacturing methods may be performed by an automatic machine, manually by an operator, or both automatically and manually.

The present invention is not limited to the foregoing embodiment, and modifications can be freely made without departing from the scope of the present invention.

DESCRIPTION OF SYMBOLS

10 portable information device
12A, 12B chassis member
16 display device
16*b* bent section (bent section of the display body)
30 display body
36 metal sheet
36*a* bent area
36*b* unbent hole area
36*c* unbent frame area
38 protection sheet
40*a*, 40*b* hole portion
42, 42A, 52 raw material sheet
44 end portion
54 reinforcing sheet Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A method for manufacturing a display device including a bendable display body and a sheet member fixed to the bendable display body, wherein a raw material sheet serving as the sheet member has a width that is greater than a width of the bendable display body in a direction along a bent section of the bendable display body, and raw material sheet holes are provided in a bent area of the raw material sheet over an entire width along the bent section of the bendable display body, the method comprising:

a display mounting process in which the bendable display body is mounted on the raw material sheet such that the bent section and the bent area are aligned and that the bendable display body avoids end portions of the raw material sheet in the direction along the bent section;

a pressure application process in which pressure is applied to the bendable display body from a central part of the bendable display body toward a periphery of the bendable display body; and a cutting process in which the raw material sheet is cut into the sheet member, wherein the sheet member is cut into a predetermined size.

2. The method for manufacturing the display device according to claim 1, further comprising:

a reinforcement process in which a reinforcing sheet having a rigidity equal to or greater than a rigidity of the raw material sheet is stuck onto the raw material sheet before the pressure application process; and a stripping process in which the reinforcing sheet is stripped from the raw material sheet after the pressure application process.

3. The method for manufacturing the display device according to claim 1, wherein
the raw material sheet is cut using a laser.

4. The method for manufacturing the display device according to claim 1, wherein,
in addition to the bent area, a portion of the raw material sheet holes are disposed in an unbent hole area of the raw material sheet, and
the bent area has more of the raw material sheet holes than the unbent hole area.

5. The method for manufacturing the display device according to claim 4, wherein
the raw material sheet includes an unbent frame area that is fixed to a periphery of the bendable display body except in the bent area, and
none of the raw material sheet holes are disposed in the unbent frame area.

6. The method for manufacturing the display device according to claim 1, wherein
the raw material sheet holes in the bent area of the raw material sheet are elongated holes extending along the bent section of the bendable display body.

7. The method for manufacturing the display device according to claim 1, wherein
the bendable display body is electroluminescent, and
the raw material sheet is a stainless steel sheet or an aluminum sheet.

8. A method for manufacturing a display device including a bendable display body and a sheet member fixed to the bendable display body, wherein raw material sheet holes are provided in a bent area of the sheet member over an entire width thereof along a bent section of the bendable display body, the method comprising:
- a display mounting process in which the bendable display body is mounted on the sheet member such that the bent section and the bent area are aligned;
- a reinforcement process in which a reinforcing sheet having a rigidity equal to or greater than a rigidity of the sheet member is stuck onto the sheet member;
- a pressure application process in which pressure is applied to the bendable display body from a central part of the bendable display body toward a periphery of the bendable display body after the reinforcement process; and
- a stripping process in which the reinforcing sheet is stripped from the sheet member after the pressure application process.

\* \* \* \* \*